United States Patent
Jeong et al.

(10) Patent No.: US 8,674,389 B2
(45) Date of Patent: Mar. 18, 2014

(54) LIGHT EMITTING DEVICE AND LIGHT EMITTING DEVICE PACKAGE HAVING THE SAME

(75) Inventors: Hwan Hee Jeong, Seoul (KR); Ji Hyung Moon, Seoul (KR); Sang Youl Lee, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/339,513

(22) Filed: Dec. 29, 2011

(65) Prior Publication Data

US 2012/0112231 A1 May 10, 2012

Related U.S. Application Data

(63) Continuation of application No. 13/011,479, filed on Jan. 21, 2011, now Pat. No. 8,143,639.

(30) Foreign Application Priority Data

Feb. 8, 2010 (KR) ........................ 10-2010-0011702

(51) Int. Cl.
*H01L 33/00* (2010.01)

(52) U.S. Cl.
USPC ............... 257/98; 257/E33.068; 257/E33.072

(58) Field of Classification Search
USPC .............. 257/98, E33.072, E33.068, E33.069
See application file for complete search history.

(56) References Cited

U.S. PATENT DOCUMENTS

| | | | |
|---|---|---|---|
| 7,335,920 B2 | 2/2008 | Denbaars et al. | |
| 7,462,869 B2 | 12/2008 | Ohashi et al. | |
| 8,143,639 B2 * | 3/2012 | Jeong et al. | 257/98 |
| 2001/0010449 A1 * | 8/2001 | Chiu et al. | 313/501 |
| 2002/0088985 A1 | 7/2002 | Komoto et al. | |
| 2008/0105882 A1 * | 5/2008 | Tan et al. | 257/79 |
| 2009/0134416 A1 | 5/2009 | Lee | |
| 2009/0141502 A1 | 6/2009 | Sonoda et al. | |

(Continued)

FOREIGN PATENT DOCUMENTS

| | | |
|---|---|---|
| CN | 101107720 A | 1/2008 |
| EP | 2 262 011 A2 | 12/2010 |

(Continued)

OTHER PUBLICATIONS

Korean Decision to Grant a Patent dated Aug. 4, 2010 issued in Application No. 102010-0011702.

(Continued)

*Primary Examiner* — Julio J Maldonado
*Assistant Examiner* — Amar Movva
(74) *Attorney, Agent, or Firm* — KED & Associates LLP

(57) ABSTRACT

Disclosed are a light emitting device and a light emitting device package. The light emitting device includes a light emitting structure including a first conductive type semiconductor layer, a second conductive type semiconductor layer, and an active layer between the first and second conductive type semiconductor layers, an electrode on the first conductive type semiconductor layer, a reflective layer under the second conductive type semiconductor layer, a protective layer on an outer portion of the reflective layer, the protective layer including a first portion between the reflective layer and the second conductive layer, and a second portion that extends beyond the second conductive type semiconductor layer; and a light extraction structure including a compound semiconductor on the second portion of the protective layer.

29 Claims, 11 Drawing Sheets

(56) References Cited

U.S. PATENT DOCUMENTS

| | | |
|---|---|---|
| 2009/0261370 A1 | 10/2009 | Jeong |
| 2010/0006881 A1 | 1/2010 | Seo et al. |
| 2010/0065872 A1 | 3/2010 | Lee |

FOREIGN PATENT DOCUMENTS

| | | |
|---|---|---|
| KR | 10-2008-0081620 A | 9/2008 |
| KR | 10-0872717 B1 | 12/2008 |
| KR | 10-2009-0104931 A | 10/2009 |
| KR | 10-2009-0111225 A | 10/2009 |
| WO | WO 2009/002040 A2 | 12/2008 |

OTHER PUBLICATIONS

Chinese Office Action dated Feb. 4, 2013 for Application 201110036026.8.

* cited by examiner

LIGHT EMITTING DEVICE AND LIGHT EMITTING DEVICE PACKAGE HAVING THE SAME

CROSS-REFERENCE TO RELATED APPLICATIONS

This application is a continuation of U.S. application Ser. No. 13/011,479 filed on Jan. 21, 2011 now U.S. Pat. No. 8,143,639, which claims priority under 35 U.S.C. 119(a) to Korean Patent Application No. 10-2010-0011702 (filed on Feb. 8, 2010), which is hereby incorporated by reference in their entirety.

BACKGROUND

The embodiment relates to a light emitting device and a light emitting device package having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a composition formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device having a light extraction structure in a channel region and a light emitting device package having the same.

The embodiment provides a light emitting device including a light extraction structure, which is provided around a light emitting structure and including a compound semiconductor, and a protective layer, and a light emitting device package having the same.

The embodiment provides a light emitting device capable of improving light extraction efficiency in a channel region of a compound semiconductor layer and a light emitting device package having the same.

The embodiment provides a light emitting device capable of improving adhesive strength between metal and non-metal in a channel region of a compound semiconductor layer, and a light emitting device package having the same.

According to an embodiment, a light emitting device includes a light emitting structure including a first conductive type semiconductor layer, a second conductive type semiconductor layer, and an active layer between the first conductive type semiconductor layer and the second conductive type semiconductor layer, an electrode on the first conductive type semiconductor layer, a reflective layer under the second conductive type semiconductor layer, a protective layer at outer peripheral portions of the second conductive type semiconductor layer and the reflective layer, and a light extraction structure including a compound semiconductor on the protective layer.

According to an embodiment, the light emitting device includes a light emitting structure including a first conductive type semiconductor layer, a second conductive type semiconductor layer, and an active layer between the first and second conductive type semiconductor layers, an electrode on the first conductive type semiconductor layer, a reflective layer under the second conductive type semiconductor layer, a protective layer at outer peripheral portions of the second conductive type semiconductor layer and the reflective layer, a light extraction structure disposed on the protective layer and having a refractive index of a nitride-based semiconductor, and a first concave-convex structure between the reflective layer and the protective layer.

According to an embodiment, a light emitting device package includes a body, a plurality of lead electrodes on the body, a light emitting device provided at least one of lead electrode, and electrically connected to the lead electrodes, and a molding member used to mold the light emitting device. The light emitting device includes a light emitting structure including a first conductive type semiconductor layer, a second conductive type semiconductor layer, and an active layer between the first conductive type semiconductor layer and the second conductive type semiconductor layer, an electrode on the first conductive type semiconductor layer, a reflective layer under the second conductive type semiconductor layer, a protective layer at outer peripheral portions of the second conductive type semiconductor layer and the reflective layer, and a light extraction structure including a compound semiconductor layer on the protective layer.

DETAILED DESCRIPTION OF THE EMBODIMENTS

Figure 1:
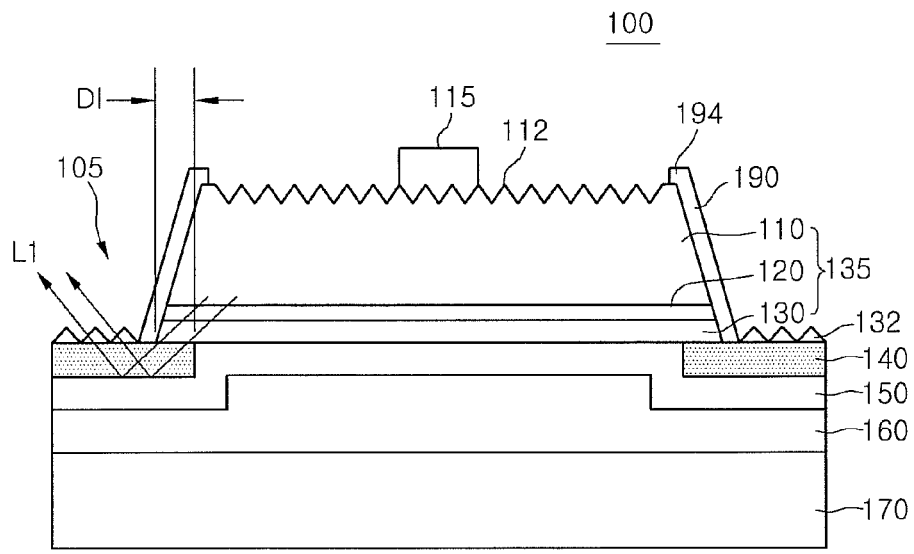
FIG. 1 is a side sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to the accompanying drawings. The thickness and size of each layer shown in the drawings may be exaggerated, omitted or schematically drawn for the purpose of convenience or clarity. In addition, the size of elements does not utterly reflect an actual size.

FIG. 1 is a side sectional view showing a light emitting device 100 according to a first embodiment.

Referring to FIG. 1, the light emitting device 100 includes a light emitting structure 135 including a plurality of compound semiconductor layers 110, 120, and 130, a light extraction structure 132 in a channel region 105, a protective layer 140, a reflective layer 150, an adhesion layer 160, and a conductive support member 170.

The light emitting device 100 may include a light emitting diode (LED) including compound semiconductors of group III-V elements. The groups III-V nitride semiconductors include a semiconductor material having a composition formula of $In_xAl_yGa_{1-x-y}N$ ($0 \leq x \leq 1$, $0 \leq y \leq 1$ and $0 \leq x+y \leq 1$). The LED may include an LED having a visible ray band to emit blue, green or red light or a UV LED having an ultraviolet band, but the embodiment is not limited thereto.

The light emitting structure 135 includes a first conductive type semiconductor layer 110, an active layer 120, and a second conductive type semiconductor layer 130.

The first conductive type semiconductor layer 110 may include one of group III-V compound semiconductors, such as GaN, InN, AlN, InGaN, AlGaN, InAlGaN, AlInN, AlGaAs, GaP, GaAs, GaAsP, and AlGaInP doped with first conductive dopants. When the first conductive type semiconductor layer 110 is an N-type semiconductor, the first conductive dopant serves as an N-type dopant, and includes at least one of Si, Ge, Sn, Se, and Te. The first conductive type semiconductor layer 110 may have a single layer structure or a multiple layer structure, but the embodiment is not limited thereto. The first conductive type semiconductor layer 110 is provided on a top surface thereof with a roughness or a pattern like the light extraction structure 112 to extract light. In addition, the first conductive type semiconductor layer 110 may be provided on the top surface thereof with a transparent electrode layer and/or an insulating layer for the purpose of current diffusion or light extraction, but the embodiment is not limited thereto.

The electrode 115 may be formed on the first conductive type semiconductor layer 110. The electrode 115 may include a pad or an electrode pattern having a branch structure connected to the pad, but the embodiment is not limited thereto. The electrode 115 is provided on a top surface thereof with a roughness, but the embodiment is not limited thereto. The light extraction structure 112 is spaced apart from the electrode 115, but the embodiment is not limited thereto.

The electrode 115 may make ohmic contact with the top surface of the first conductive type semiconductor layer 110, and may include one of Cr, Ti, Al, In, Ta, Pd, Co, Ni, Si, Ge, Ag, Cu, Au, and alloy thereof in a single layer structure or a multiple layer structure. The electrode 115 may selectively include the above materials in consideration to ohmic contact with the first conductive type semiconductor layer 110, an adhesion property between metallic layers, a reflective property, and conductivity.

The active layer 120 is provided under the first conductive type semiconductor layer 110. The active layer 120 may have at least one of a single quantum well structure, a multiple quantum well structure, a quantum wire structure, and a quantum dot structure. The active layer 120 may have a stack structure including a well layer and a barrier layer, which are made from compound semiconductors of group III-V elements. For example, the active layer 120 may have a stack structure of an InGaN well layer/GaN barrier layer, an InGaN well layer/AlGaN barrier layer, or an InGaN well layer/InGaN layer. The band gap of the barrier layer may be higher than the band gap of the well layer.

A conductive clad layer may be formed on and/or under the active layer 120. The conductive clad layer may include an AlGaN-based semiconductor. The band gap of the conductive clad layer may be higher than the band gap of the barrier layer.

The second conductive type semiconductor layer 130 is provided under the active layer 120. The second conductive type semiconductor layer 130 includes the compound semiconductors of group III-V elements doped with the second conductive dopant. For instance, the second conductive type semiconductor layer 130 may include at least one selected from the group consisting of GaN, AlN, AlGaN, InGaN, InN, InAlGaN, AlInN, AlGaAs, GaP, GaAs, GaAsP, and AlGaInP. If the second conductive type semiconductor layer is a P type semiconductor layer, the second conductive dopant includes the P type dopant such as Mg or Ze. The second conductive type semiconductor layer 130 may have a single layer structure or a multiple layer structure, but the embodiment is not limited thereto.

The light emitting structure 135 may further include a third conductive type semiconductor layer under the second conductive type semiconductor layer 130. The third conductive type semiconductor layer may have polarities opposite to those of the second conductive type semiconductor layer 130. The first conductive type semiconductor layer 110 may include a P-type semiconductor layer, and the second conductive type semiconductor layer 130 may include an N-type semiconductor. Accordingly, the light emitting structure 135 may include at least one of an N-P junction structure, a P-N junction structure, an N-P-N junction structure, and a P-N-P junction structure. A lateral surface of the light emitting structure 135 may be inclined or vertically formed. Hereinafter, a case in which the second conductive type semiconductor layer 130 is the lowest layer of the light emitting structure 135, will be described for the purpose of explanation.

The protective layer 140 and the reflective layer 150 are formed under the second conductive type semiconductor layer 130. The reflective layer 150 is provided at an inner portion of the second conductive type semiconductor layer 130, and the protective layer 140 is provided at an outer peripheral portion of the second conductive type semiconductor layer 130. The protective layer 40 may be defined as a channel layer for the light emitting device.

A portion of the protective layer 140 extends beyond the second conductive type semiconductor layer 130 so that the protective layer 140 is exposed to the channel region 105. The channel region 105 has a stepped structure between the light emitting structure 135 and the conductive support member 170, and may be an outer peripheral portion of a device.

An outer portion of a top surface of the protective layer 140 is provided outside the light emitting structure 135. The light extraction structure 132 is formed at the outer portion of the top surface of the protective layer 140. The light extraction structure 132 may include a material different from that of the protective layer 140, or may include a material having a refractive index different from that of a material of the protective layer 140. The light extraction structure 132 may include a roughness or a pattern, or may have a concave-convex structure on the outer portion of the top surface of the protective layer 140.

The light extraction structure 132 may include group III-V compound semiconductors, and the compound semiconductor may include a second conductive dopant. The group III-V compound semiconductor may include one selected from the group consisting of GaN, AlN, AlGaN, InGaN, InN, InAlGaN, AlInN, AlGaAs, GaP, GaAs, GaAsP, and AlGaInP. The light extraction structure 132 may include a material identical to that of the protective layer 140, but the embodiment is not limited thereto. In addition, the light extraction structure 132 may include different from a material of the group III-V compound semiconductor layer. For example, the light extraction structure 132 may include $TiO_2$ powder or $Al_2O_3$ powder. In addition, the light extraction structure 132 may include a transparent material instead of an insulating material.

The light extraction structure 132 may include a material having a refractive index identical to or lower than a refractive index of a nitride-based semiconductor. The light extraction structure 132 may include a material to scatter or refract incident light.

The light extraction structure 132 has a thickness of 1000□ or more. For example, the light extraction structure 132 may have a height less than or equal to the thickness of the second conductive type semiconductor layer 130 or may have a height lower than the top surface of the first conductive type semiconductor layer 110. In addition, the light extraction structure 132 may have a thickness from the second conductive type semiconductor 130 to the lower surface of the first conductive type semiconductor layer 110. The light extraction structure 132 may have a thickness of about 5000□±500□ for the purpose of light extraction efficiency. The light extraction structure 132 may have a pyramid shape, a prism shape, a strip shape or a lens shape.

The light extraction structure 132 may have a discontinuous ring shape or a continuous ring shape at the outer peripheral portion of the light emitting structure 135. In addition, the light extraction structure 132 may have roughness patterns or predetermined patterns formed at a regular interval or an irregular interval along the outer portion of the light emitting structure 135.

A portion of light emitted from the active layer 120 is incident onto the protective layer 140, and the light extraction structure 132 changes the critical angle of a light L1 traveling to the outer portion of the top surface of the protective layer 140, so that the light may be extracted to the outside. In addition, A portion of light emitted from the active layer 120 is incident onto the light extraction structure 132 through the insulating layer 190

The inner portion of the protective layer 140 makes contact with the lower surface of the second conductive type semiconductor layer 130 by a predetermined width D1. In this case, the width D1 is in the range of a few micrometers (μm) to a few tens micrometers (μm), and may have various values according to a chip size.

The protective layer 140 may be formed at an outer peripheral portion of a lower surface of the second conductive type semiconductor layer 130 in the shape of a loop, a ring, or a frame. The protective layer 140 may have a continuous pattern or a discontinuous pattern. The protective layer 140 may be formed on the path of a laser beam irradiated to the channel region 105 in the manufacturing process.

The protective layer 140 may include a material having a refractive index lower than that of group III-V compound semiconductors. For example, the protective layer 140 may include one selected from the group consisting of transparent oxide, transparent nitride, or a transparent insulating layer. In detail, the protective layer 140 may include indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, SiOx, $SiO_xN_y$, $Si_3N_4$, $Al_2O_3$, or $TiO_2$.

When the protective layer is $SiO_2$, the protective layer 140 has a refractive index of about 2.3, the refractive index of ITO is about 2.1, and a refractive index of GaN is about 2.4. Accordingly, light incident onto the protective layer 140 through the second conductive type semiconductor 130 may be emitted through the light extraction structure 132. In addition, in the protective layer 230, adjacent materials represent a low difference in a refractive index, so that the critical angle of traveling light is changed to improve light extraction efficiency.

The protective layer 140 prevents the light emitting structure 135 from being shorted even if the outer wall of the light emitting structure 135 is exposed to moisture, so that LED having strong moisture resistance. If the protective layer 140 includes a transparent material, when a laser scribing process is performed, the protective layer 140 transmits a laser beam, so that a metallic material is prevented from being broken due to the laser beam in the channel region 105. Accordingly, interlayer short problem can be prevented at the sidewall of the light emitting structure 135.

In addition, the light extraction structure 132 can prevent moisture from permeating and increase the inflow path of the moisture, so that chip reliability can be improved.

Outer walls of the layers 110, 120 and 130 of the light emitting structure 135 can be spaced part from the reflective layer 150 by the protective layer 140. The protective layer 140 may have a thickness of 0.02 μm to 5 μm, and the thickness of the protective layer 140 may vary according to a chip size.

The reflective layer 150 makes ohmic contact with the lower surface of the second conductive type semiconductor layer 130. The reflective layer 150 may include seed metal, and the seed metal is used to perform a plating process. Accordingly, the reflective layer 150 may include at least one of an ohmic layer, a seed layer, or a reflective layer, but the embodiment is not limited thereto.

The reflective layer 150 may extend beyond the lower surface of the protective layer 140, may fully or partially cover the lower surface of the protective layer 140. The reflective layer 150 may be formed by 80% or less of the width of the protective layer 140 on a portion of the lower surface of the protective layer 140.

The reflective layer 150 may have a width greater than at least the width of the light emitting structure 135. In this case, incident light may be effectively reflected. Accordingly, light extraction efficiency can be improved.

The reflective layer 150 may be formed in a single layer or a multiple layer by using Ag, Ni, Al, Rh, Pd, Ir, Ru, Mg, Zn, Pt, Au, Hf, or the selective combination thereof. The reflective layer 150 may be formed in a multiple layer by using the above materials, and IZO, IZTO, IAZO, IGZO, IGTO, AZO, and ATO. For example, the reflective layer 150 may have a stack structure of IZO/Ni, AZO/Ag, IZO/Ag/Ni, or AZO/Ag/Ni.

The adhesion layer 160 may be formed under the reflective layer 150, and may make contact with the lower surface of the protective layer 140, but the embodiment is not limited thereto. The adhesion layer 160 includes barrier metal or bonding metal. For example, the adhesion layer 160 includes at least one of Ti, Au, Sn, Ni, Cr, Ga, In, Bi, Cu, Ag and Ta.

The adhesion layer 160 serves as a bonding layer, and is bonded to a lower surface of the conductive support member 170. The conductive support member 170 can be plated on the electrode layer 150 or attached to the electrode layer 150 in the form of a sheet without using the adhesion layer 160.

The conductive support member 170 is formed under the adhesion layer 160, and the conductive support member 170 serves as a base substrate. The conductive support member 170 may include at least one of copper (Cu), gold (Au), nickel (Ni), molybdenum (Mo), copper-tungsten (Cu—W), or a carrier wafer such as Si, Ge, GaAs, ZnO, SiC, SiGe, or GaN. The conductive support member 170 may not be formed, or may include a conductive sheet.

The insulating layer 190 may be formed at the outer portion of the light emitting structure 135. In detail, a portion of the insulating layer 190 partially makes contact with the protective layer 140 on the protective layer 140. An upper end 194 of the protective layer 140 extends to an outer peripheral portion of a top surface of the first conductive type semiconductor layer 110. Accordingly, the insulating layer 190 closely makes contact with the protective layer 140, and is formed around the light emitting structure 135, so that interlayer short can be prevented at an outer lateral surface of the light emitting structure 135. The insulating layer 190 may include a material, such as $SiO_2$, $SiO_x$, $SiO_xN_y$, $Si_3N_4$, $Al_2O_3$, or $TiO_2$, having a refractive index lower than a refractive index (GaN: about 2.4) of the compound semiconductor.

FIGS. 2 to 11 are sectional views showing a method of manufacturing the light emitting device of FIG. 1.

Figure 2:
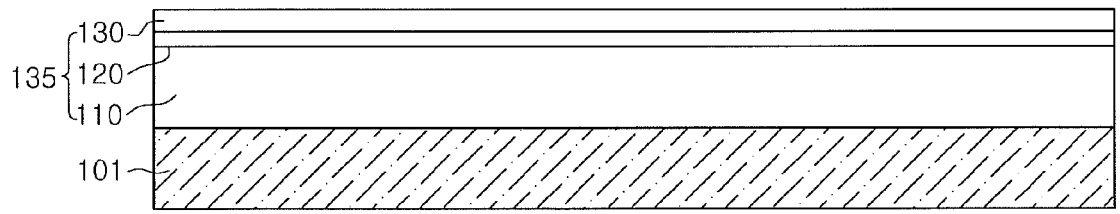
FIGS. 2 to 11 are views showing a method of manufacturing the light emitting device of FIG. 1.
Figure 3:
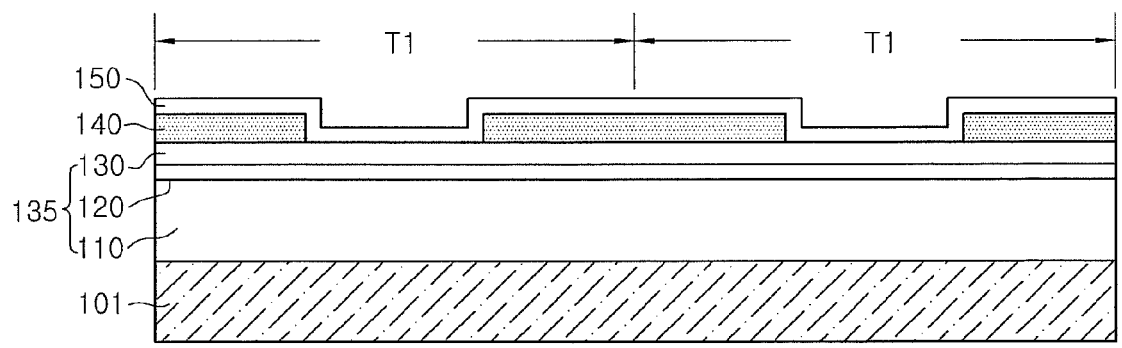

Referring to FIGS. 2 and 3, a substrate 101 is loaded into growth equipment and compound semiconductors of group II to VI elements are formed on the substrate 101 in the form of a layer or a pattern.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

The substrate 101 may include one selected from the group consisting of $Al_2O_3$, GaN, SiC, ZnO, Si, GaP, InP, $Ga_2O_3$, conductive material, and GaAs. A concave-convex pattern can be formed on the top surface of the substrate 101. The substrate 101 may be formed thereon with a layer or a pattern including compound semiconductors of group II to VI elements. For example, the substrate 101 may be formed thereon with at least one of a ZnO layer (not shown), a buffer layer (not shown), and an undoped semiconductor layer (not shown). The buffer layer or the undoped semiconductor layer may include compound semiconductors of group III-V elements. The buffer layer reduces a lattice constant difference between the substrate 101 and the compound semiconductor layer. The undoped semiconductor layer may include a nitride-based semiconductor which is not doped with dopants.

The first conductive type semiconductor layer 110 is formed on the substrate 101, and the active layer 120 is formed on the first conductive type semiconductor layer 110. In addition, the second conductive type semiconductor layer 130 is formed on the active layer 120.

The first conductive type semiconductor layer 110 may include one of group III-V compound semiconductors, such GaN, AlN, AlGaN, InGaN, InN, InAlGaN, AlInN, AlGaAs, GaP, GaAs, GaAsP, and AlGaInP, doped with first conductive dopants. When the first conductive type semiconductor layer 110 is an N-type semiconductor, the first conductive dopant serves as an N-type dopant, and includes at least one of Si, Si, Ge, Sn, Se, and Te. The first conductive type semiconductor layer 110 may have a single layer structure or a multiple layer structure, but the embodiment is not limited thereto.

The active layer 120 is formed on the first conductive type semiconductor layer 110, and may have at least one of a single quantum well structure or a multiple quantum well structure. The active layer 120 may have a stack structure including a well layer and a barrier layer, which are made from compound semiconductors of group III-V elements. For example, the active layer 120 may have a stack structure of an InGaN well layer/GaN barrier layer, an InGaN well layer/AlGaN barrier layer, or an InGaN well layer/InGaN layer, but the embodiment is not limited thereto. The band gap of the barrier layer may be higher than the band gap of the well layer.

A conductive clad layer may be formed on and/under the active layer 120, and may include a nitride-based semiconductor. The band gap of the conductive clad layer may be higher than a band gap of the barrier layer.

The second conductive type semiconductor layer 130 is provided on the active layer 120. The second conductive type semiconductor layer 130 includes the compound semiconductors of group III-V elements doped with the second conductive dopant. For instance, the second conductive type semiconductor layer 130 may include at least one selected from the group consisting of GaN, AlN, AlGaN, InGaN, InN, InAlGaN, AlInN, AlGaAs, GaP, GaAs, GaAsP, and AlGaInP. If the second conductive type semiconductor layer is a P type semiconductor layer, the second conductive dopant includes the P type dopant such as Mg or Ze. The second conductive type semiconductor layer 130 may have a single layer structure or a multiple layer structure, but the embodiment is not limited thereto.

The first conductive type semiconductor layer 110, the active layer 120, and the second conductive type semiconductor layer 130 may be defined as the light emitting structure 135. In addition, the second conductive type semiconductor 130 is provided thereon with the third conductive type semiconductor, for example, an N-type semiconductor having polarities opposite to those of a second conductive type. Thus, the light emitting structure 135 may include at least one of an N-P junction structure, a P-N junction structure, an N-P-N junction structure, and a P-N-P junction structure.

Figure 4:
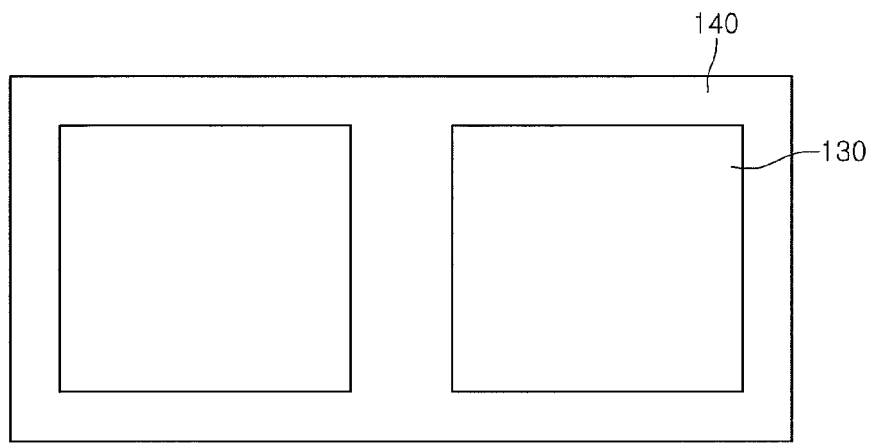

Referring to FIGS. 3 and 4, the protective layer 140 is formed at a boundary region between chips having a size T1. The protective layer 140 is formed at an outer peripheral portion of an individual chip region by using a mask pattern. The protective layer 140 may have a continuous pattern or a discontinuous pattern having a ring shape, a loop shape, or a frame shape. The protective layer 140 may include a material (e.g., an oxide, a nitride, or an insulating material) having a refractive index lower than that of compound semiconductors of group III-V elements. The protective layer 140 may include one selected from the group consisting of ITO, IZO, IZTO, IAZO, IGZO, IGTO, AZO, ATO, GZO, $SiO_2$, $SiO_x$, $SiO_xN_y$, $Si_3N_4$, $Al_2O_3$, and $TiO_2$. The protective layer 140 is patterned by using a mask through a lithography process. The protective layer 140 may be formed through a sputtering scheme or a deposition scheme using the above materials. If the protective layer 140 is a conductive oxide, the protective layer 140 may serve as a current diffusion layer or a current injection layer.

Figure 5:
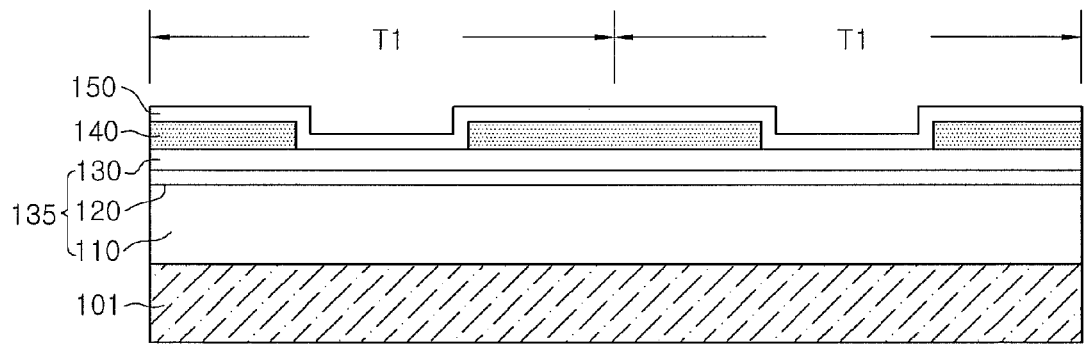
Figure 6:
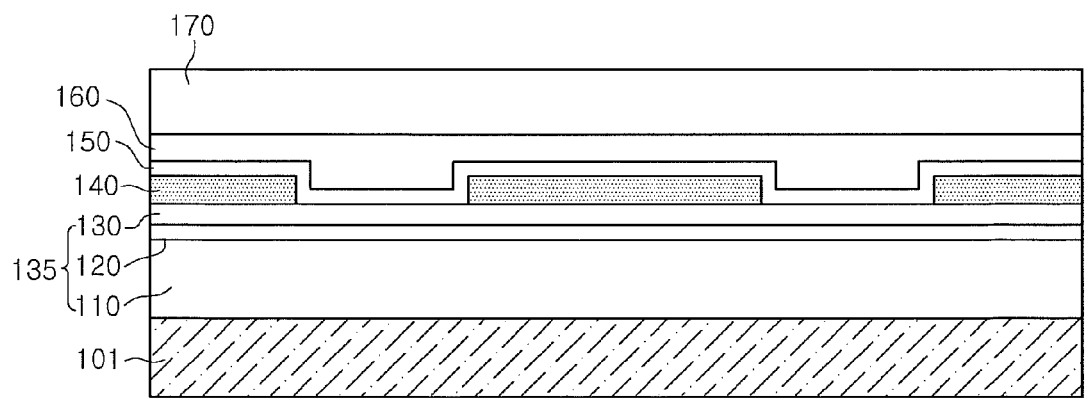

Referring to FIGS. 5 and 6, the reflective layer 150 is formed on the second conductive type semiconductor layer 130. The reflective layer 150 makes ohmic contact with the second conductive type semiconductor layer 130. The reflective layer 150 is formed on the second conductive type semiconductor layer 130 to reduce contact resistance.

The reflective layer 150 may be formed in a single layer structure or a multiple layer structure by using Ag, Ni, Al, Rh, Pd, Ir, Ru, Mg, Zn, Pt, Au, Hf or the selective combination thereof. In addition, the reflective layer 150 may have a multiple layer structure by using the above materials and conductive oxide materials such as IZO, IZTO, IAZO, IGZO, IGTO, AZO, and ATO. For example, the reflective layer 150 may have a stack structure of IZO/Ni, AZO/Ag, IZO/Ag/Ni, or AZO/Ag/Ni. The reflective layer 150 may be deposited through an E-beam (electrode beam) scheme or a sputtering scheme, but the embodiment is not limited thereto. The reflective layer 150 may include a material having an ohmic characteristic.

The electrode layer 150 may have a stack structure of a first adhesion layer/reflective layer/second adhesion layer/seed layer. The first and second adhesion layers include Ni, the reflective layer includes Ag, and the seed layer includes Cu. The first adhesion layer has a thickness of a few nanometers (nm) or less, and the electrode layer has a thickness of a few hundreds nanometers (nm). The second adhesion layer may have a thickness of a few tens nanometers (nm), and the seed layer may have a thickness of about 1 µm or less, but the embodiment is not limited thereto The reflective layer 150 may fully cover the whole area of the protective layer 140 or partially cover the protective layer 140. Since the reflective layer 150 includes reflective metal, the reflective layer 150 may serve as an electrode. In addition, the reflective layer 150 and metallic materials thereon may serve as an electrode.

The adhesion layer 160 is formed on the reflective layer 150. The adhesion layer 160 includes barrier metal or bonding metal. For example, the adhesion layer 160 may include at least one of Ti, Au, Sn, Ni, Cr, Ga, In, Bi, Cu, Ag and Ta, but the embodiment is not limited thereto.

The adhesion layer 160 may serve as a bonding layer, and the top surface of the adhesion layer 160 is bonded with the conductive support member 170. The conductive support member 170 serves as a base substrate. The conductive support member 170 may include Cu, Au, Ni, Mo, Cu—W, or a carrier wafer such as Si, Ge, GaAs, ZnO, SiC, SiGe, or GaN. The conductive support member 170 may be bonded with the adhesion layer 160, formed as a coating layer of the adhesion layer 160, or attached to the adhesion layer 160 in the form of a conductive sheet. According to the embodiment, the adhesion layer 160 may not be formed. In this case, the conductive support member 170 may be formed on the electrode layer 150.

Figure 7:
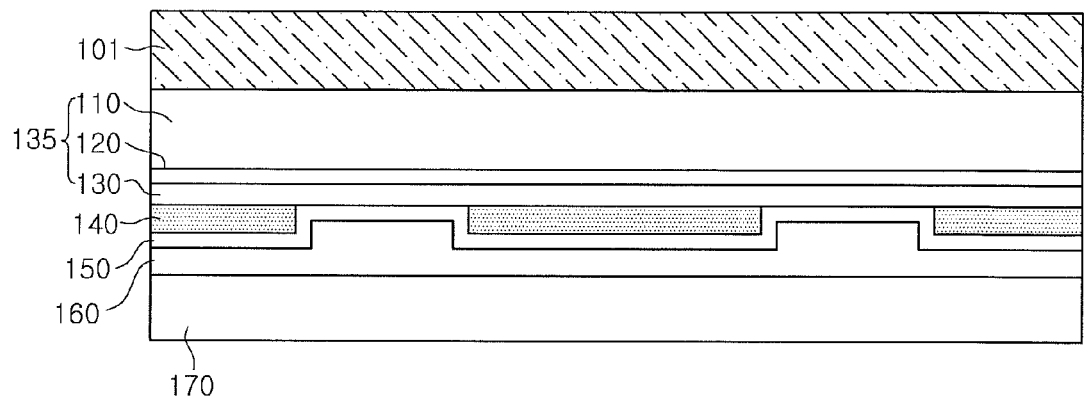
Figure 8:
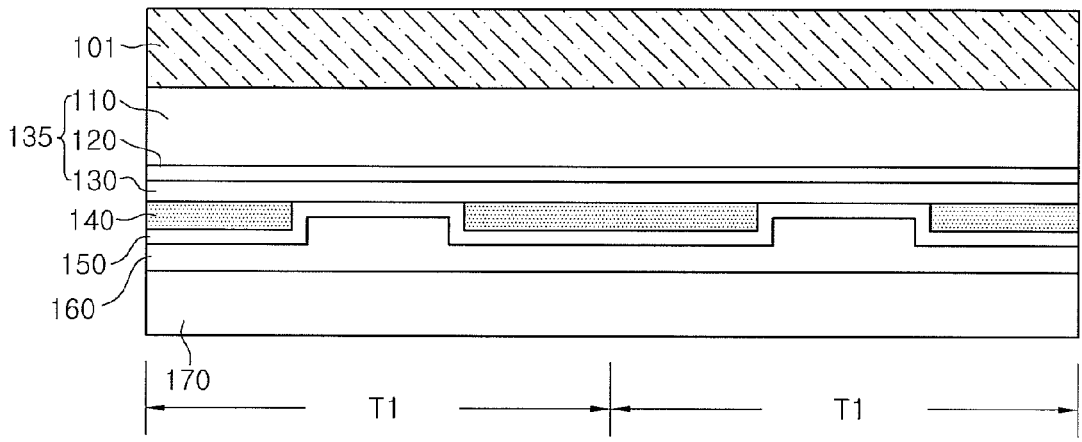

Referring to FIGS. 7 to 8, the conductive support member 170 is placed at a base, and the substrate 101 is provided on the light emitting structure 135. Therefore, the substrate 101 is removed.

The substrate 101 may be removed through a laser lift off (LLO) process. According to the LLO process, a laser beam having a predetermined wavelength band is irradiated into the substrate 101 to separate the substrate 101. If another semiconductor layer (e.g., buffer layer) or air gap exists between the substrate 101 and the first conductive type semiconductor layer 110, the substrate 101 may be separated by using wet etching solution, but the embodiment is not limited to the scheme of removing the substrate 101.

Figure 9:
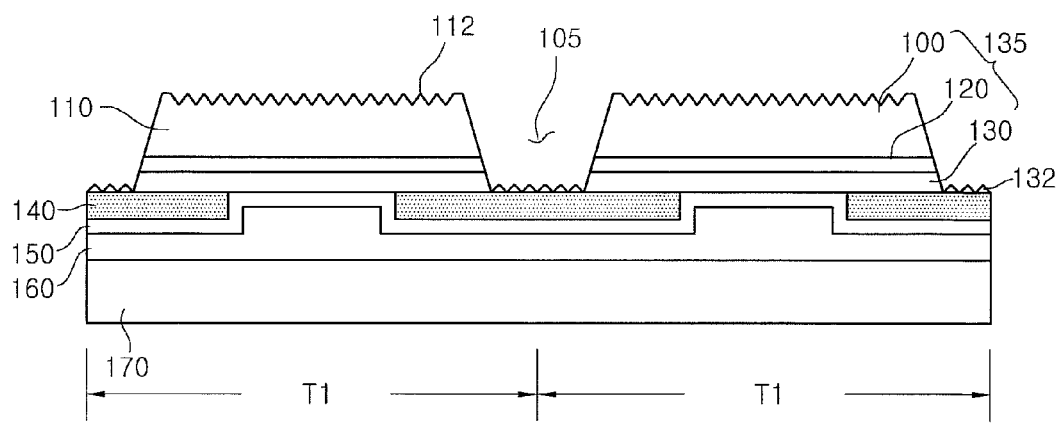

Referring to FIG. 9, the light emitting structure 135 corresponding to the channel region 105 which is a boundary region between chips having a size T1 is removed through an isolation etching process. In other words, an isolation etching process is performed with respect to the boundary region between chips, so that a portion of the protective layer 140 can be exposed, and the lateral surface of the light emitting structure 135 may be inclined or vertically formed.

In this case, the light extraction structure 132 having a predetermined pattern may be formed instead of a portion of the light emitting structure 145 provide in the channel region 150. Accordingly, the light extraction structure 132 may be formed with a conical shape, a prism shape, a strip shape or a lens shape on the outer portion of the protective layer 140, and the shapes may vary according to etching schemes.

At least portion of the light extraction structure 132 may include a material the same as that of the second conductive type semiconductor layer 130, and, for example, may include one selected from the group consisting of compound semiconductors of group III-V elements doped with second conductive dopants. In detail, the at least portion of the light extraction structure 132 may include at least one selected from the group consisting of GaN, AlN, AlGaN, InGaN, InN, InAlGaN, AlInN, AlGaAs, GaP, GaAs, GaAsP, and AlGaInP. In addition, the light extraction structure 132 may be formed through a texture process or an additional etching process instead of an isolation etching process.

The light extraction structure 132 may have a thickness of about 1000□ or more. The light extraction structure 132 may have a thickness less than that of the second conductive type semiconductor layer 130, or identical to a thickness from the second conductive type semiconductor layer 132 to the active layer 120, or identical to a thickness to the lower surface of the first conductive type semiconductor layer 130. The light extraction structure 132 may have a thickness of 5000□±500□ for the purpose of light extraction efficiency.

If the protective layer 140 includes a transparent material, the protective layer 140 transmits irradiated laser beam in the isolation etching process or the laser scribing process to prevent lower metal materials such as the electrode layer 150, the adhesion layer 160, and the conductive support member 170 from protruding in the irradiation direction of the laser beam or from being broken.

The protective layer 140 transmits the laser beam, so that metal fragments are prevented from occurring in the channel region 105, and the outer wall of each layer of the light emitting structure 135 can be protected.

Then, an etching process is performed with respect to the top surface of the first conductive type semiconductor layer 110, thereby forming the light extraction structure 112, and the light extraction structure 112 may have a roughness or a pattern, so that light extraction efficiency can be improved.

Figure 10:
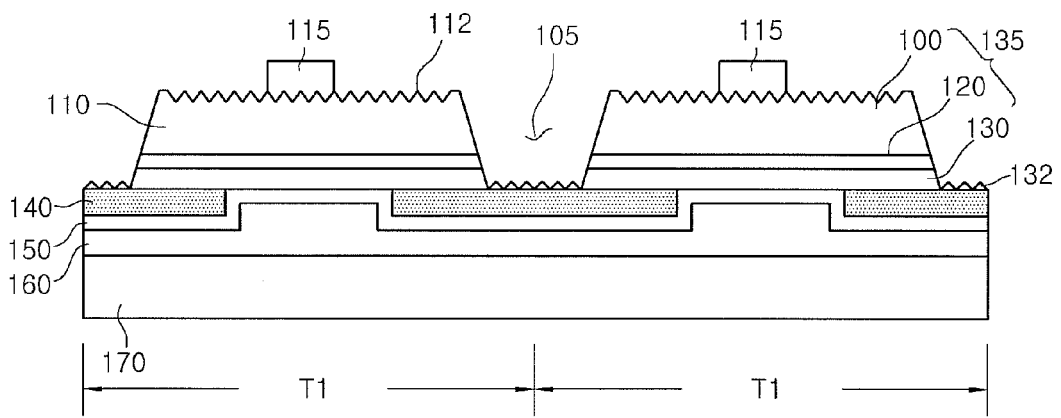
Figure 11:
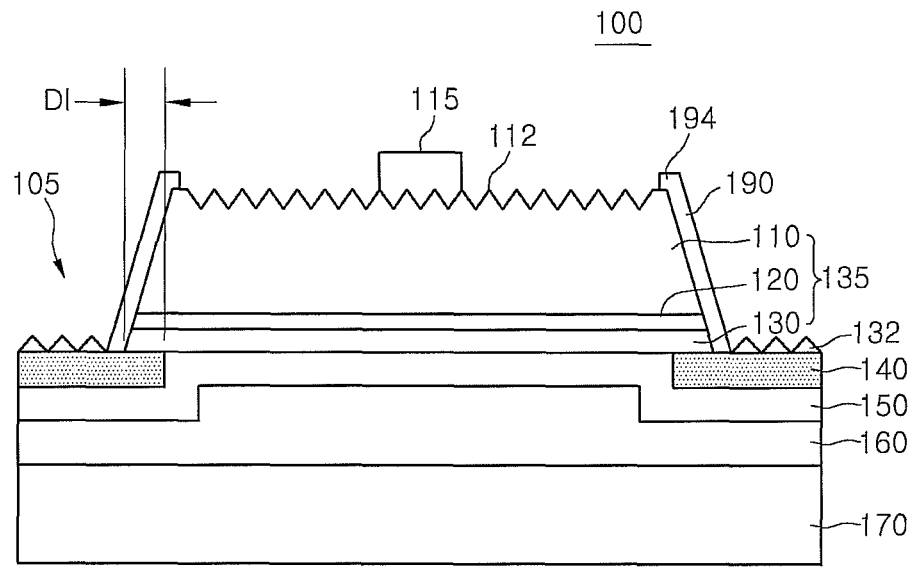

Referring to FIGS. 10 and 11, the insulating layer 190 is formed at the outer peripheral portion of the light emitting structure 135. The insulating layer 190 is formed at an outer peripheral portion of a chip. A lower end of the insulating layer 190 is formed on the protective layer 140, and the upper end of the insulating layer 190 may extend to the top surface of the first conductive type semiconductor layer 110. The insulating layer 190 is formed at the outer peripheral portion of the light emitting structure 135, thereby preventing short from occurring the layers 110, 120, and 130 of the light emitting structure 135. In addition, the insulating layer 190 and the protective layer 140 may prevent moisture from permeating into the chip.

The insulating layer 190 may include an insulating material having a refractive index lower than that (e.g., GaN: 2.4) of the compound semiconductor. For example, the insulating layer 190 may include $SiO_2$, $SiO_x$, $SiO_xN_y$, $Si_3N_4$, $Al_2O_3$, or $TiO_2$.

In addition, the light extraction structure 132 can prevent moisture from permeating and increase the inflow path of the moisture, so that chip reliability can be improved.

The electrode 115 may be formed on the first conductive type semiconductor layer 110. The electrode 115 may include a branch pad or a branch pattern having a predetermined shape. The insulating layer 190 and the electrode 115 are formed after or before chip separating is performed, but the embodiment is not limited thereto.

Individual chip units are separated about a chip boundary. In this case, the individual chip units may be separated through a cutting process, a laser process, or a breaking process.

An inner portion of the top surface of the protective layer 140 makes contact with the outer portion of the lower surface of the second conductive type semiconductor layer 130 by a predetermined width D1. The width D1 may be in the range of a few micrometers (μm) to a few tens micrometers (μm), and the width D1 may vary according to a chip size.

A portion of light emitted from the active layer 120 is incident onto the protective layer 140, and the light extraction structure 132 changes the critical angle of a light L1 traveling to the top surface of the protective layer 140, so that the light may be extracted to the outside.

Figure 12:
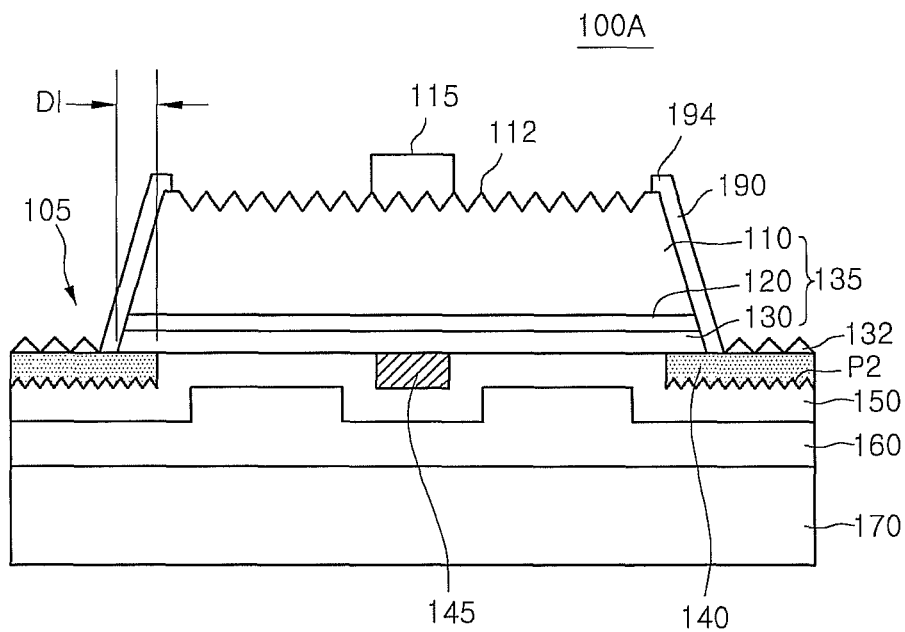
FIG. 12 is a side sectional view showing a light emitting device according to a second embodiment.

FIG. 12 is a side sectional view showing a light emitting structure 100A according to the second embodiment. Hereinafter, the second embodiment will be described while focusing on the difference from the first embodiment in order to avoid redundancy of explanation.

Referring to FIG. 12, the light emitting device 100A includes a current blocking layer 145 and a protective layer 140 having a concave-convex structure P2. The concave-convex structure P2 may be defined as an internal light extraction structure provided inside a chip, and the light extraction structure 132 may be defined as an outer light extraction structure provide outside the chip.

The current blocking layer 145 may be formed at a region between the reflective layer 150 and the second conductive type semiconductor layer 130, and may include non-metallic material having electrical conductivity lower than that of the reflective layer 150. The current blocking layer 145 may include at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, and $TiO_2$. If the reflective layer 150 includes Ag, the current blocking layer 145 may include a material such as ITO, ZnO, or $SiO_2$.

The current blocking layer 145 may include a material the same as or different from a material of the protective layer 140. If the current blocking layer 145 and the protective layer 140 include the same material, the current blocking layer 145 and the protective layer 140 may be formed through the same process.

The position of the current blocking layer 145 corresponds to the position of the electrode 115, and the current blocking layer 145 has a pattern corresponding to that of the electrode 115. The size of the current blocking layer 145 may vary according to the diffusion degree of current. The current blocking layer 145 may have a polygonal pattern or a circular pattern. The current blocking layer 145 overlaps with at least a portion of the electrode 115 and/or a pad, so that current can be diffused outward of the current blocking layer 145.

In addition, the current blocking layer 145 may be formed at the interfacial surface between the reflective layer 150 and the adhesion layer 160, or between the second conductive type semiconductor layer 130 and the adhesion layer 160.

The concave-convex structure P2 is formed on the lower surface of the protective layer 140, and increases a contact area with the reflective layer 150, so that the adhesive strength of the protective layer 140 can be improved. The concave-convex structure P2 of the protective layer 140 may change the critical angle of incident light or emitted light. The concave-convex structure P2 may have a roughness or a predetermined pattern.

Accordingly, the concave-convex structure P2 provided under the protective layer 140 and the light extraction structure 132 provided on the protective layer 130 change the critical angle of light incident onto the protective layer 140, so that light extraction efficiency can be improved around the chip.

Figure 13:
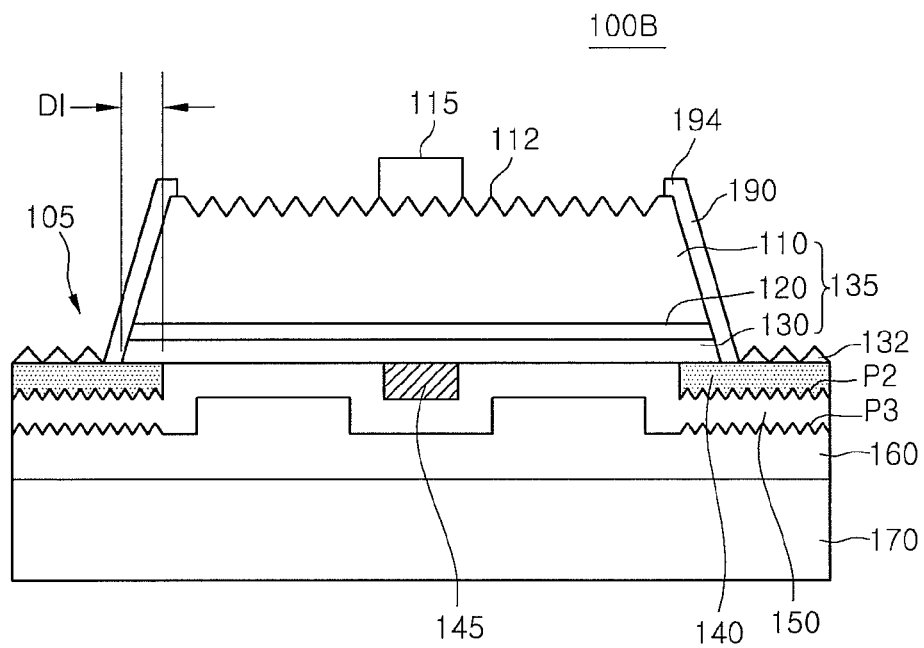
FIG. 13 is a side sectional view showing a light emitting device according to a third embodiment.

FIG. 13 is a side sectional view showing a light emitting device 100B according to a third embodiment. Hereinafter, the third embodiment will be described while focusing on the difference from the above disclosed embodiments in order to avoid redundancy.

Referring to FIG. 13, the light emitting device 100B may have concave-convex structures P2 and P3 formed on outer portions of top and lower surfaces of the reflective layer 150. In other words, the concave-convex structures P2 and P3 are formed on the outer portion of the top and lower surfaces of the reflective layer 150, so that interlayer adhesive strength at an interfacial surface between the reflective layer 150 and other layers 140 and 160 at an outer portion of the chip.

The concave-convex structure P2 formed at the interfacial surface between the protective layer 140 and the reflective layer 150 diffuse-reflects light incident onto the protective layer 140, and the light extraction structure 132 provided on the protective layer 140 change the critical angle of light, so that light extraction efficiency can be improved. The concave-convex structures P2 and P3 may include a roughness having a triangular sectional shape, and may be defined as a light extraction structure inside the chip.

Figure 14:
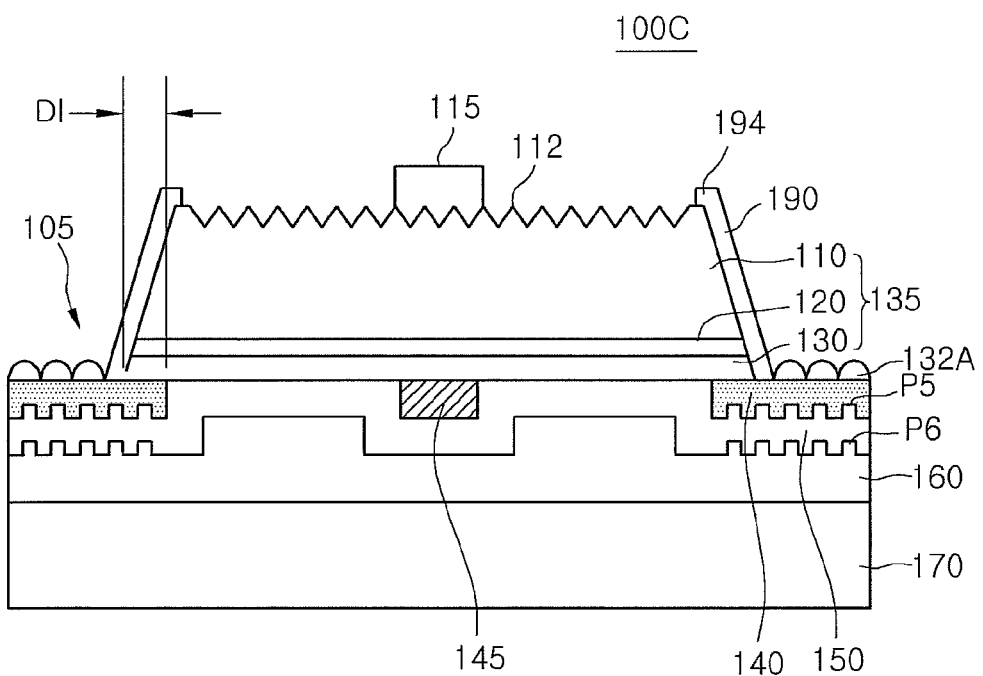
FIG. 14 is a side sectional view showing a light emitting device according to a fourth embodiment.

FIG. 14 is a side sectional view showing a light emitting device 100C according to a fourth embodiment. Hereinafter, the fourth embodiment will be described while focusing on the difference from the above disclosed embodiments in order to avoid redundancy of explanation.

Referring to FIG. 14, the light emitting device 100C may have first and second concave-convex structures P5 and P6 formed on outer portions of top and lower surfaces of the protective layer 140. The first and second concave-convex structures P5 and P6 can improve an adhesive strength with the layers 140 and 160 on and/or under the first and second concave-convex structures P5 and P6.

The concave-convex structure P5 between the reflective layer 150 and the protective layer 140 diffuse-reflects light incident onto the protective layer 140, and a light extraction structure 132A provided on the protective layer 140 changes the critical angle of incident light. The light extraction structure 132A may have a lens shape. In this case, the orientation angle of the light can be adjusted outside the chip. The light extraction structure 132A may have a lens shape through a dry etching scheme and/or a wet etching scheme using a mask pattern, but the embodiment is not limited thereto.

Figure 15:
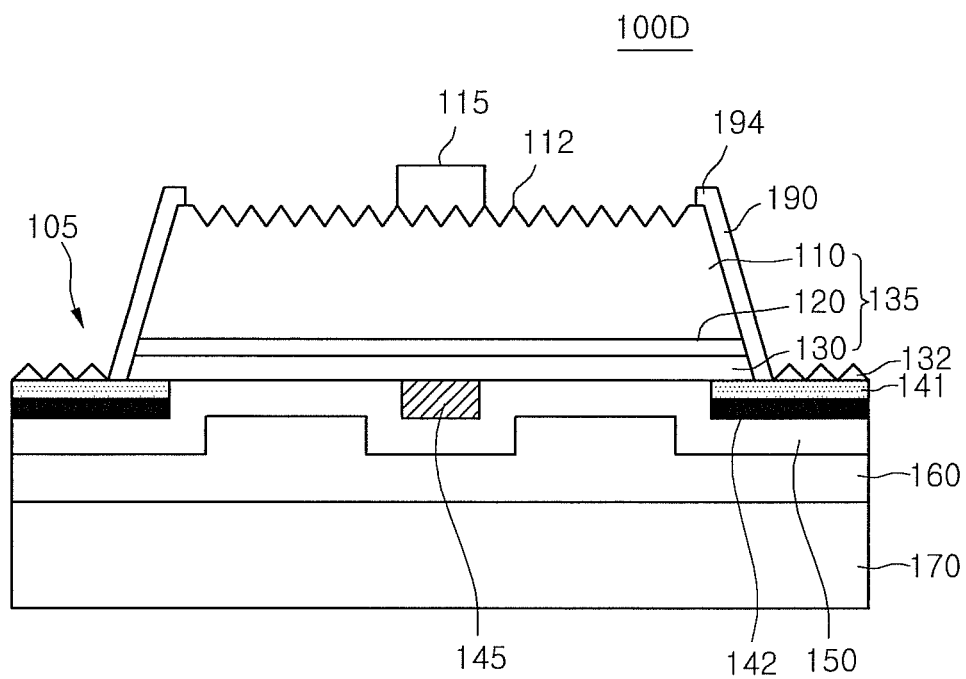
FIG. 15 is a side sectional view showing a light emitting device according to a fifth embodiment.

FIG. 15 is a side sectional view showing a light emitting device 100D according to a fifth embodiment. Hereinafter, the fifth embodiment will be described while focusing on the difference from the above disclosed embodiments in order to avoid redundancy.

Referring to FIG. 15, the light emitting device 100D has a stack structure of a protective layer 141 and a capping layer 142 in the channel region 105. An inner portion of the protective layer 141 makes contact with the lower surface of the second conductive type semiconductor layer 130, and may include an oxide-based material such as ITO, IZO, IZTO, IAZO, IGZO, IGTO, AZO, ATO, GZO, $SiO_2$, $SiO_x$, $Al_2O_3$, or $TiO_2$.

The capping layer 142 may include metal having superior adhesive strength with oxide. For example, the capping layer 142 may include one of Ti, Ni, Pt, Pd, Cu, Al, Ir, Rh, and mixture thereof. The capping layer 142 is an adhesive layer in a single layer structure or a multiple layer structure including the above material, and improves adhesive strength between oxide and metal, so that delamination is prevented from occurring at an outer wall of the chip. The capping layer 142 may have a thickness of a few hundred micrometers or less. The capping layer 142 may be deposited through an e-beam deposition scheme or a sputtering scheme, but the embodiment is not limited thereto.

The capping layer 142 is interposed between the lower surface of the protective layer 141 and the reflective layer 150 to improve adhesive strength of the reflective layer 150, so that interlayer delamination can be prevented from occurring at the outer wall of the chip. In addition, light incident onto the protective layer 141 is reflected by the capping layer 142, and output to the outside by the light extraction structure 132 protruding from the protective layer 141.

Figure 16:
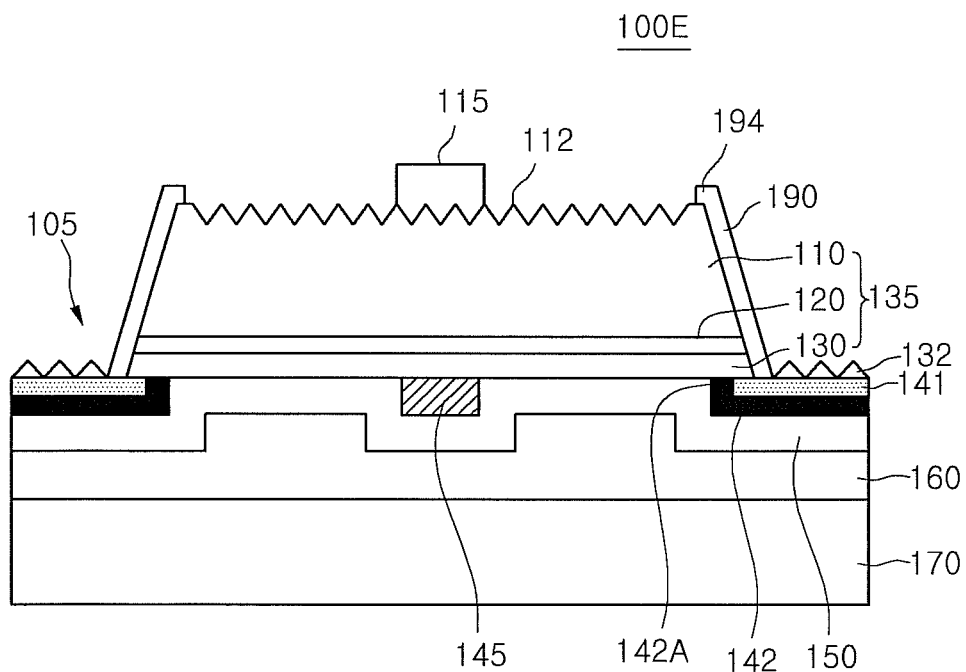
FIG. 16 is a side sectional view showing a light emitting device according to a sixth embodiment.

FIG. 16 is a side sectional view showing a light emitting device according to a sixth embodiment. The sixth embodiment will be described while focusing on the difference from the disclosed embodiments in order to avoid redundancy of explanation.

Referring to FIG. 16, the light emitting device 100E includes the protective layer 141 and the capping layer 142 provided around the lower portion of the protective layer 141.

The protective layer 141 is formed at the outer portion of the lower surface of the light emitting structure 130, and the capping layer 142 is provided under the protective layer 141. The protective layer 141 is formed in a ring shape, a stripe shape, or a band shape along the outer peripheral portion of the chip. The capping layer 142 extends beyond the lower surface and an internal lateral surface of the protective layer 141. An internal end portion 142A of the capping layer 142 is formed in a strip shape, a loop shape, or a ring shape along a region between the reflective layer 150 and the protective layer 141. The internal end portion 142A of the capping layer 142 makes contact with a lower surface of the second conductive type semiconductor layer 130, so that current may be supplied through the capping layer 142.

Figure 17:
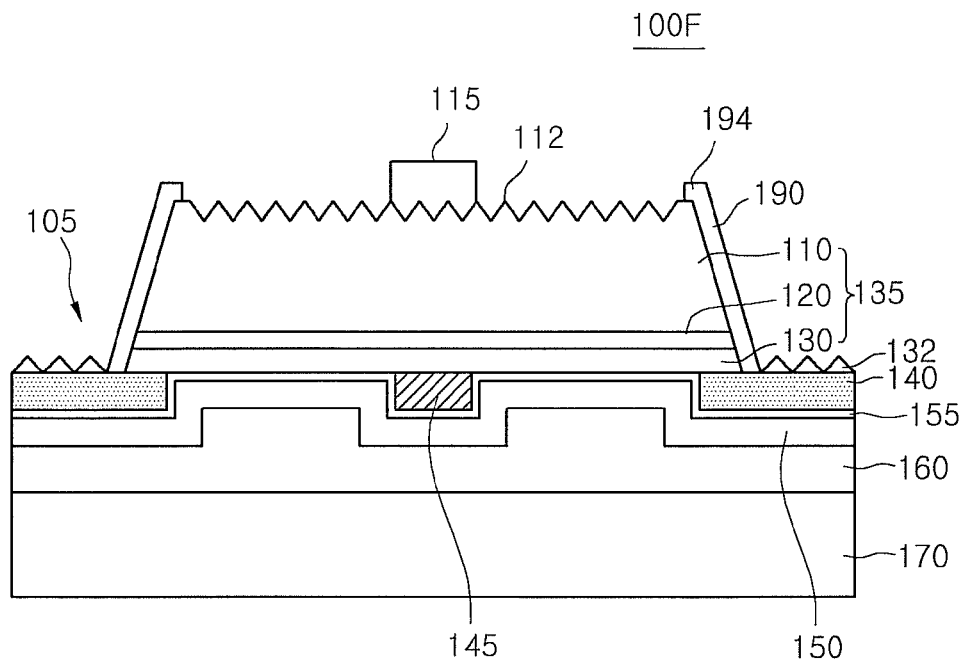
FIG. 17 is a side sectional view showing a light emitting device according to a seventh embodiment.

FIG. 17 is a side sectional view showing a light emitting device 100F according to a seventh embodiment. The seventh embodiment will be described while focusing on the difference from the disclosed embodiments in order to avoid redundancy of explanation.

Referring to FIG. 17, the light emitting device 100F includes the light emitting structure 135, the protective layer 140, the current blocking layer 145, the reflective layer 150, the ohmic layer 155, the adhesion layer 160, and the conductive support member 170.

The protective layer 140 is provided at the outer peripheral portion of the lower surface of the second conductive type semiconductor layer 130, and the current blocking layer 145 and the ohmic layer 155 are provided inside the second conductive type semiconductor layer 130. The protective layer 140 is considered with reference to the protective layer of the first embodiment.

The current blocking layer 145 is interposed between the second conductive type semiconductor layer 130 and the ohmic layer 155 to diffuse current outward of the current blocking layer 145.

The ohmic layer 155 is formed between the second conductive type semiconductor layer 130 of the light emitting structure 135 and the reflective layer 150, and may include a conductive oxide-based material such as ITO, IZO, IZTO, IAZO, IGZO, IGTO, AZO, ATO, or GZO. In other words, the ohmic layer 155 makes ohmic contact with the lower surface of the second conductive type semiconductor layer 130. The ohmic layer 155 may be formed through a sputtering scheme (e.g., radio-frequency-magnetron sputtering) or a deposition scheme, but the embodiment is not limited thereto. The ohmic layer 155 may have a thickness of a few tens nanometers (nm), but the embodiment is not limited thereto.

The ohmic layer 155 makes contact with lower surfaces of the protective layer 140, the second conductive type semiconductor layer 130, and the current blocking layer 145 to supply current applied through the adhesion layer 160 to the second conductive type semiconductor layer 130.

The ohmic layer 155 partially or fully covers the lower surface of the protective layer 140 to transmit or reflect light incident onto the protective layer 140, and the light extraction structure 132 protruding from the protective layer 140 changes the critical angle of light.

Figure 18:
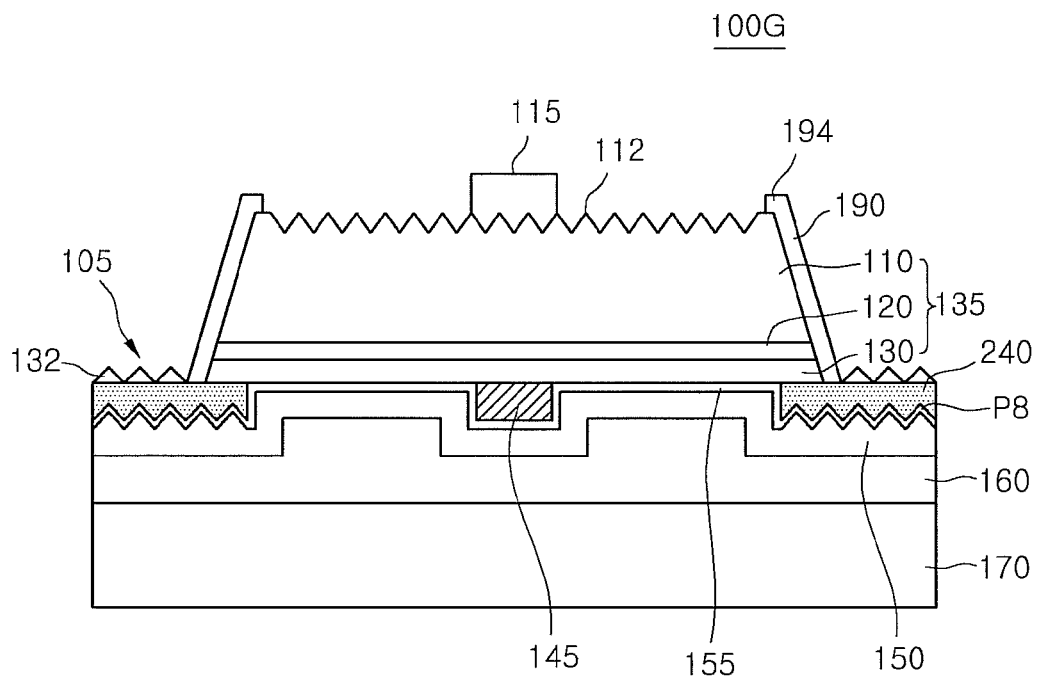
FIG. 18 is a side sectional view showing a light emitting device according to an eighth embodiment.

FIG. 18 is a side sectional view showing a light emitting device 100G according to an eighth embodiment, and the eighth embodiment will be described while focusing on the difference from the disclosed embodiments in order avoid redundancy of explanation.

Referring to FIG. 18, the light emitting device 100G includes a concave-convex structure P8 formed by etching a lower portion of a protective layer 240, and an outer portion of the ohmic layer 155 has concave and convex patterns alternately aligned with each other along the concave-convex structure P8. The concave-convex structure P8 increases a contact area between two adjacent layers to improve an adhesive strength. The concave-convex structure P8 can reflect light incident through the protective layer 240 such that the light can be effectively extracted through the light extraction structure 132. The concave-convex structure P8 may be defined as a light extraction structure provided inside a chip, and may be defined as an external light extraction structure provided outside the chip.

Figure 19:
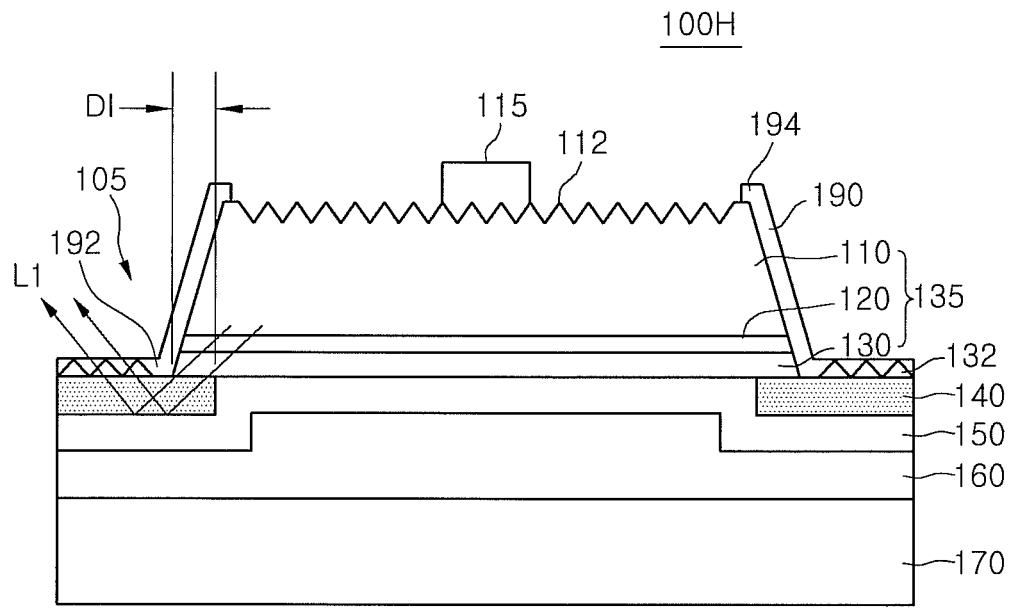
FIG. 19 is a side sectional view showing a light emitting device according to a ninth embodiment.

FIG. 19 is a side sectional view showing a light emitting device 100H according to a ninth embodiment, and the ninth embodiment will be described while focusing on the difference from the disclosed embodiments in order avoid redundancy of explanation.

Referring to FIG. 19, the light emitting device 100H includes the insulating layer 190 provided in the channel region 105, and a lower portion 192 of the insulating layer 190 covers the light extraction structure 132. The light extraction structure 132 and the insulating layer 190 can extract light incident onto a top surface of the protective layer 140. The insulating layer 190 may include a material having a refractive index lower than a refractive index (GaN: 2.4) of the compound semiconductor. For example, the insulating layer 190 may include $SiO_2$, $SiO_x$, $SiO_xN_y$, $Si_3N_4$, $Al_2O_3$, or $TiO_2$.

A light extraction structure to be formed on the top surface of the disclosed reflective layer, on the top surface/lower surface of the reflective layer, on the top surface of the protective layer, or on the top/lower surface of the protective layer may include at least one of a sawtooth shape, a square wave shape, a concave-convex shape, or a strip shape, but the embodiment is not limited thereto. In addition, the light extraction structure may be a roughness.

Figure 20:
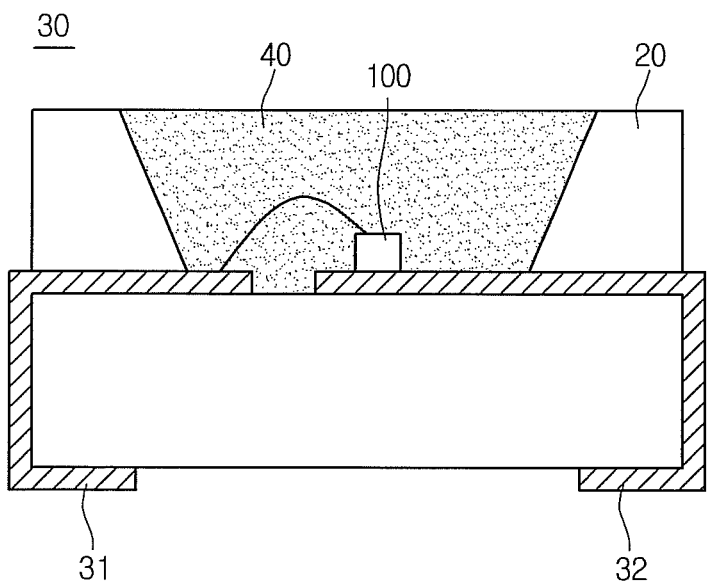
FIG. 20 is a side sectional view showing a light emitting device package according to a tenth embodiment.

FIG. 20 is a sectional view showing a light emitting device package 30 according to a tenth embodiment.

Referring to FIG. 20, the light emitting device package 30 according to the embodiment includes a body 10, first and second lead electrode layers 31 and 32 formed on the body 10, the light emitting device 100 provided on the body 10 and electrically connected to the first and second electrode layers 31 and 32 and a molding member 40 that surrounds the light emitting device 100.

The body 20 may include a conductive substrate including silicon, synthetic resin including PPA, a ceramic substrate, an insulating substrate, or a metallic substrate (e.g., MCPCB). An inclined surface may be formed around the light emitting device 100. The body 20 may include a through hole structure, but the embodiment is not limited thereto.

The first and second lead electrodes 31 and 32 are electrically insulated from each other and supply power to the light emitting device 100. The first and second lead electrodes 31 and 32 may reflect light emitted from the light emitting device 100 to increase light efficiency, and may discharge heat emitted from the light emitting device 100 to the outside.

The light emitting device 100 may be mounted on the body 20 or on the first and second lead electrodes 31 and 32.

The light emitting device 100 may be electrically connected with the first lead electrode 31 through a wire, and may be connected with the second lead electrode 32 through a die bonding scheme.

The molding member 40 may protect the light emitting device 100 while surrounding the light emitting device 100. In addition, the molding member 40 may include phosphors to change the wavelength of light emitted from the light emitting device 100. A lens may be provided on the molding member 40, and the lens may be realized in a contact structure or a non-contact structure with the molding member 40.

The light emitting device 100 may be electrically connected with the body 20 or a lower surface of a substrate via a through hole.

At least one of the above light emitting devices according to the embodiments may be mounted is the light emitting package, but the embodiment is not limited thereto.

Although the embodiment has been described in that the light emitting device package has a top view type, the light emitting device package may have a side view type. Accordingly, a heat sink characteristic, conductivity, and a reflectance characteristic can be improved. After such a top-view-type or side-view-type light emitting device is packaged in the resin layer, a lens may be formed on the resin layer or the lens may be bonded with the resin layer, but the embodiment is not limited thereto.

<Lighting System>

The light emitting devices and the light emitting device packages according to the embodiments may be applied to a light unit. The light unit may have an array structure including a plurality of light emitting devices or a plurality of light emitting device packages. The lighting system may include a display apparatus shown in FIGS. 21 and 22, a light unit shown in FIG. 23, in addition to a lighting lamp, a signal light, a vehicle headlight, an electronic display, etc.

Figure 21:
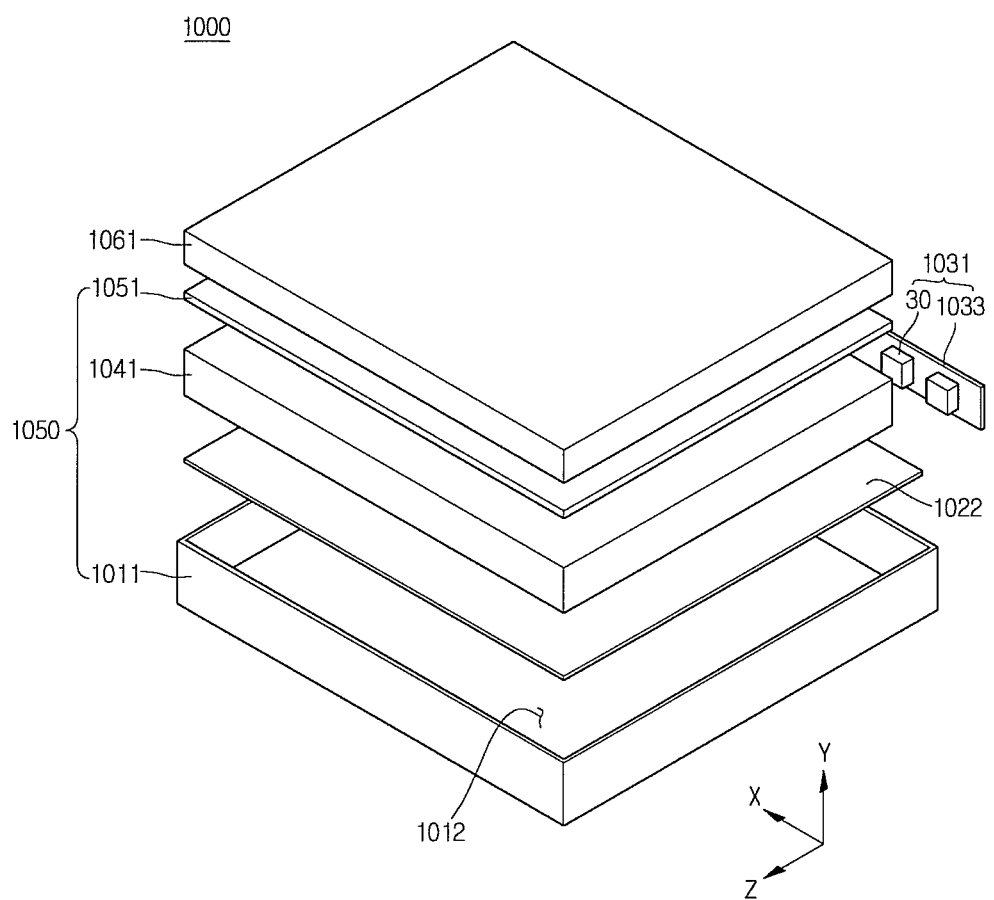
FIG. 21 is a disassembled perspective view of a display apparatus provided with the light emitting device.

FIG. 21 is a disassembled perspective view of a display apparatus according to an embodiment.

Referring to FIG. 21, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

Figure 22:
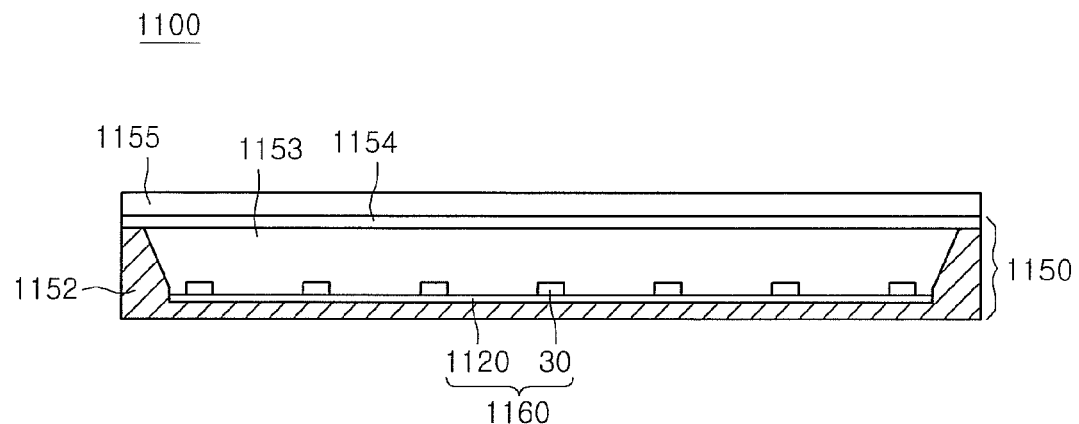
FIG. 22 is a schematic sectional view illustrating another example of a display apparatus provided with the light emitting device.

FIG. 22 is a cross-sectional view of a display apparatus according to an embodiment.

Referring to FIG. 22, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

Figure 23:
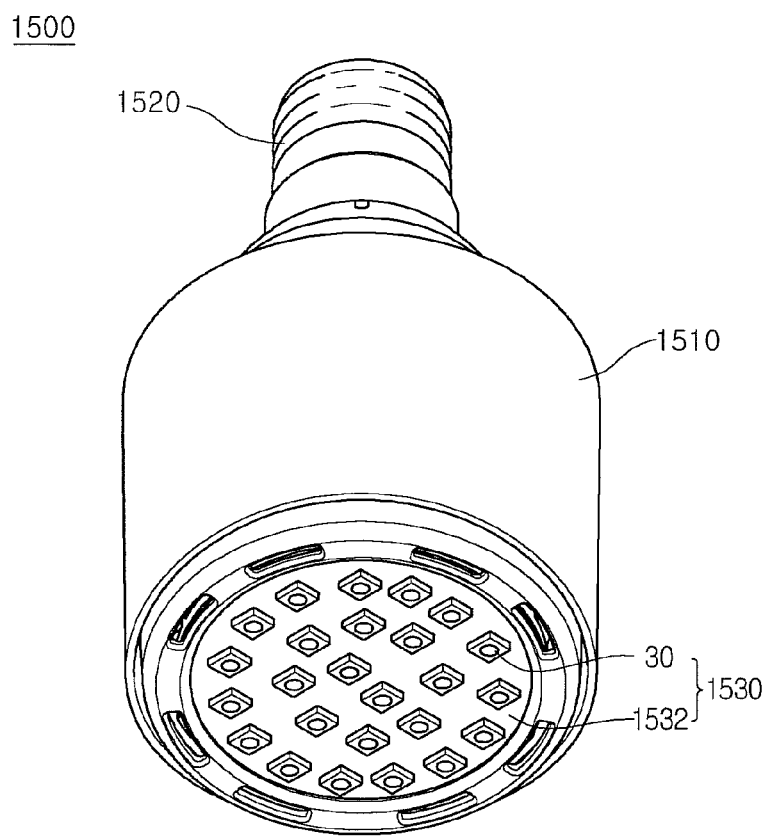
FIG. 23 is a perspective view of a lighting apparatus provided with the light emitting device.

FIG. 23 is a perspective view of a lighting unit according to an embodiment.

Referring to FIG. 23, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

As shown in FIG. 20, according to the embodiment, a package of the light emitting device 100 may be arranged on the substrate to realize the light emitting module. In addition, after the light emitting device 10 of FIG. 1 is provided on the substrate, the resultant structure may be packaged to realize the light emitting module.

A method of manufacturing a semiconductor light emitting device according to the embodiment includes steps of forming a plurality of compound semiconductors on a substrate, forming a protective layer at an outer peripheral portion of a top surface of the compound semiconductor layer, forming a reflective layer on the compound semiconductor layer and the protective layer, providing the reflective layer at a base and removing the substrate, etching a channel region of the compound semiconductor, forming a compound semiconductor having a concave-convex structure on the protective layer, and forming an electrode on the compound semiconductor layer.

According to the embodiment, light extraction efficiency can be improved in the channel region. Adhesive strength between layers under the semiconductor layer can be improved, and adhesive strength between metal and nonmetal in the channel region under the semiconductor layer can be improved. According to the embodiment, adhesive strength between an oxide and a reflective material under the semiconductor layer can be improved, so that interlayer delamination can be prevented from occurring in the channel region. According to the embodiment, the reliability for the semiconductor light emitting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a light emitting structure including a first conductive type semiconductor layer, a second conductive type semiconductor layer, and an active layer between the first and second conductive type semiconductor layers;
an electrode on a top surface of the first conductive type semiconductor layer;
a reflective layer on a first lower surface of the second conductive type semiconductor layer;
a conductive support member under a lower surface of the reflective layer; and
a protective layer including a first portion on a second lower surface of the second conductive type semiconductor and a second portion that extends from the first portion to outwardly beyond the second lower surface of the second conductive type semiconductor layer,
wherein a first light extraction structure directly contacts an upper surface of the second portion of the protective layer,
wherein an entire region of the first light extraction structure is located at a lower position than a lower surface of the first conductive type semiconductor layer,
wherein the first light extraction structure is located at an outer position than an outer sidewall of the light emitting structure,
wherein the first light extraction structure includes a material different from the protective layer, and
wherein the protective layer includes a transmissive material different from the second conductive type semiconductor layer.

2. The semiconductor light emitting device of claim 1, wherein an inner portion of the protective layer is disposed around a lower surface of the second conductive type semiconductor layer.

3. The semiconductor light emitting device of claim 1, wherein the first light extraction structure includes a semiconductor material identical to a semiconductor material of the second conductive type semiconductor layer.

4. The semiconductor light emitting device of claim 1, wherein the reflective layer contacts the first lower surface of the second conductive type semiconductor layer.

5. A semiconductor light emitting device comprising:
a light emitting structure including a first conductive type semiconductor layer, a second conductive type semiconductor layer, and an active layer between the first and second conductive type semiconductor layers;
an electrode on the first conductive type semiconductor layer;
a reflective layer under the second conductive type semiconductor layer;
a conductive layer formed of a conductive oxide between the reflective layer and the second conductive type semiconductor layer; and
a protective layer on an outer portion of the reflective layer, the protective layer including a first portion between the reflective layer and the second conductive type semiconductor layer, and the protective layer including a second portion that extends beyond the second conductive type semiconductor layer,
wherein the second portion of the protective layer is exposed to an external area,
wherein a first light extraction structure is directly formed on an upper surface of the exposed second portion of the protective layer,
wherein the conductive layer contacts a lower surface of the second conductive type semiconductor layer.

6. The semiconductor light emitting device of claim 1, further comprising a current blocking layer partially vertically overlapping with the electrode,
wherein the current blocking layer directly contacts a lower surface of the second conductive type semiconductor layer, and the current blocking layer has electrical conductivity less than electrical conductivity of the reflective layer,
wherein the current blocking layer is disposed between the lower surface of the second conductive type semiconductor layer and the reflective layer.

7. The semiconductor light emitting device of claim 1, further comprising an adhesion layer between the conductive support member and the reflective layer.

8. The semiconductor light emitting device of claim 5, wherein the conductive layer extends under a lower surface of the protective layer.

9. The semiconductor light emitting device of claim 1, further comprising a capping layer under a lower surface of the protective layer, wherein the capping layer is disposed between the protective layer and the outer portion of the reflective layer,
wherein the capping layer has an opening region therein,
wherein the capping layer has a different material from the protective layer.

10. The semiconductor light emitting device of claim 5, wherein the conductive layer contacts a lower portion of the protective layer, and the semiconductor light emitting device further comprises a capping layer contacting at least one of the conductive layer and the protective layer.

11. The semiconductor light emitting device of claim 9, wherein the capping layer includes at least one selected from the group consisting of Ti, Ni, Pt, Pd, Cu, Al, Ir, and Rh.

12. The semiconductor light emitting device of claim 5, wherein the protective layer or the conductive layer includes at least one of transmissive nitride, transmissive oxide, and transmissive insulating material.

13. The semiconductor light emitting device of claim 1, wherein the protective layer includes at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

14. The semiconductor light emitting device of claim 1, further comprising an insulating layer at an outer peripheral portion of the light emitting structure,
wherein a portion of the insulating layer directly contacts the first light extraction structure.

15. The semiconductor light emitting device of claim 1, wherein the first light extraction structure is provided in at least one of a conical shape, a prism shape, a strip shape, and a lens shape.

16. The semiconductor light emitting device of claim 1, further comprising a second light extraction structure disposed on at least one of a lower surface of the protective layer and a top surface of the reflective layer.

17. The semiconductor light emitting device of claim 5, wherein an outer portion of the conductive layer includes a second light extraction structure, and the outer portion of the conductive layer is disposed between the protective layer and the reflective layer.

18. The semiconductor light emitting device of claim 14, wherein the portion of the insulating layer is disposed on the first light extraction structure.

19. The semiconductor light emitting device of claim 1, wherein a top surface of the first conductive type semiconductor layer includes a second light extraction structure.

20. The semiconductor light emitting device of claim 1, wherein a height of the first light extraction structure is less than a thickness of the first conductive type semiconductor layer.

21. The semiconductor light emitting device of claim 1, wherein the first light extraction structure includes a compound semiconductor.

22. The semiconductor light emitting device of claim 1, wherein the first light extraction structure includes a transparent material.

23. The semiconductor light emitting device of claim 5, wherein a material of the first light extraction structure is different from the protective layer.

24. The semiconductor light emitting device of claim 1, wherein the first light extraction structure includes a material having a refractive index identical to or less than a refractive index of a nitride-based semiconductor.

25. The semiconductor light emitting device of claim 1, wherein the first light extraction structure includes a material to scatter or refract incident light.

26. The semiconductor light emitting device of claim 1, wherein the first light extraction structure includes a roughness or a pattern of a concave-convex structure.

27. The semiconductor light emitting device of claim 1, wherein the first light extraction structure has a discontinuous ring shape or a continuous ring shape at an outer peripheral portion of the light emitting structure.

28. The semiconductor light emitting device of claim 1, wherein the first portion of the protective layer directly contacts the second conductive type semiconductor layer.

29. The semiconductor light emitting device of claim 1, wherein the first light extraction structure directly contacts the upper surface of the second portion of the protective layer.

* * * * *